(12) United States Patent
McBeth

(10) Patent No.: US 8,510,704 B2
(45) Date of Patent: Aug. 13, 2013

(54) INTEGRATED CIRCUIT DESIGN SYSTEM AND METHOD

(75) Inventor: Fletcher Phinis McBeth, Carlsbad, CA (US)

(73) Assignee: VHDL, Inc, Carlsbad, CA (US)

( * ) Notice: Subject to any disclaimer, the term of this patent is extended or adjusted under 35 U.S.C. 154(b) by 400 days.

(21) Appl. No.: 12/755,311

(22) Filed: Apr. 6, 2010

(65) Prior Publication Data

US 2011/0035718 A1 Feb. 10, 2011

Related U.S. Application Data

(60) Provisional application No. 61/211,909, filed on Apr. 6, 2009.

(51) Int. Cl.
*G06F 17/50* (2006.01)
(52) U.S. Cl.
USPC .......................................... 716/136; 716/101

(58) Field of Classification Search
USPC ................................................. 716/101, 136
See application file for complete search history.

(56) References Cited

U.S. PATENT DOCUMENTS 7,958,340 B2 * 6/2011 Hoover et al. ................. 712/219

* cited by examiner

*Primary Examiner* — Thuan Do
(74) *Attorney, Agent, or Firm* — Mintz Levin Cohn Ferris Glovsky and Popeo, P.C.

(57) ABSTRACT

An electronic system design platform and method are presented. The electronic system design platform includes a computing system that hosts a virtual channel manager. The virtual channel manager provides a graphical editor for receiving user input specifying design specifications of the integrated circuit, and the design specifications specify a number of functional blocks and current physical communication conditions between pairs of the functional blocks. The virtual channel manager is further adapted for designing a virtual channel interface for the current physical communication conditions between the pairs of the functional blocks, and selecting a communication protocol that is best suited for each virtual channel interface.

4 Claims, 24 Drawing Sheets

| Virtual Channel Manager | | | | |
|---|---|---|---|---|
| System Identifier | | | | |
| Item Type | Item Number | Item Name | Source | Destination |
| Block | 1 | Process 1 | n/a | n/a |
| | 2 | Process 2 | n/a | n/a |
| Channel | 3 | P1P2 | 1 | 2 |
| | 4 | P2P1 | 2 | 1 |

FIG. 11

INTEGRATED CIRCUIT DESIGN SYSTEM AND METHOD

CROSS REFERENCE TO RELATED APPLICATIONS

This application claims the benefit of priority under 35 U.S.C. §119 to U.S. Provisional Patent Application Ser. No. 61/211,909, filed on Apr. 6, 2009, entitled, "ELECTRONIC SYSTEM DESIGN SYSTEM AND METHOD", the entire disclosures of which is incorporated by reference herein.

BACKGROUND

This disclosure relates generally to integrated circuits, and more particularly to a design platform, environment and methodology for designing processing services for integrated circuits.

FIG. 1 depicts a conventional data-flow architecture organized as a set of sequentially cascaded processes 104 separated by First In First Out (FIFO) 102 storage queues. FIG. 2 depicts another, slightly more interdependently organized data-flow architecture composed of processes 104 interconnected by First In First Out (FIFO) 102 storage queues. Regardless of the complexity of the process-to-process system interdependencies, the fundamental quantum or granularity within a data-flow architecture can be embodied as a single communication channel composed of an active source process 104, a passive FIFO 102, and an active destination process 104, as shown in FIG. 3.

Being that the FIFO is usually considered an ancillary element within the process-to-process communication channel, it is often conceptually "orphaned" when introducing architectural partitioning, as shown in FIG. 4. However, as shown in FIG. 5, the processes 104, the FIFO 102 and interconnections 106 (usually wires or bundles of wires) are physical devices. As such, the FIFO 102 is usually "adopted" to reside within the partition boundary of one of the two processes. In FIG. 6, the FIFO 102 is shown being associated with the source process—thereby producing a pull protocol interface between the two functional blocks. Alternatively, the FIFO 102 can be associated with the destination process—thereby producing a push protocol interface between the two functional blocks. This arbitrary choice of FIFO-residing-upstream-vs-FIFO-residing-downstream placement has, as can be seen, ramifications as to which of the two interface protocols becomes implemented. This push-vs-pull interface protocol uncertainty is a detail that must be resolved on an interface-by-interface basis and is often a source of data-flow module incompatibility.

Conceptually, a FIFO 102 could reside within each of the functional modules participating with said channel. Defining both an upstream (passive) FIFO and a downstream (passive) FIFO introduces a new FIFO-to-FIFO interface which necessitates the need to introduce an active communication channel 110 with its own protocol, such as RS-232, for example, or USB, Firewire, Hypertransport, Ethernet, or wireless protocol, etc. This representative FIFO-to-FIFO active communication channel 110 is shown in FIG. 7.

In summary, whether the communication channel is a FIFO push, a FIFO pull, RS232, Ethernet, Wireless, or other communication channel, the functional-block-to-functional-block's physical interface and corresponding communication channel protocol must be explicitly specified prior to being able to successfully interface with it. This is the source of some problems. Specifically, there are a multitude of communication channel protocols from which to choose; each communication channel protocol (industrial standards and otherwise) exists to optimally overcome an anticipated set of physical operational conditions; therefore, the choice of which communication channel protocol is based upon the anticipated operational set of physical conditions.

However, some critical physical operational conditions that will exist at the point of system deployment can only be determined after the system has been designed. For example, within a multi-FPGA system, which module will reside within which FPGA can not be determined until the sizes of each design module can be empirically determined.

SUMMARY

In general, this document discusses a system and method for using virtualized communication channels in a web-centric distributed design environment to develop and implement processing services for integrated circuits.

In one aspect, an electronic system design platform is presented. The electronic system design platform includes a computing system that hosts a virtual channel manager. The virtual channel manager provides a graphical editor for receiving user input specifying design specifications of the integrated circuit, and the design specifications specify a number of functional blocks and current physical communication conditions between pairs of the functional blocks. The virtual channel manager is further adapted for designing a virtual channel interface for the current physical communication conditions between the pairs of the functional blocks, and selecting a communication protocol that is best suited for each virtual channel interface The details of one or more implementations are set forth in the accompanying drawings and the description below. Other features and advantages will be apparent from the description and drawings, and from the claims.

BRIEF DESCRIPTION OF THE DRAWINGS

These and other aspects will now be described in detail with reference to the following drawings.

FIG. 11 shows a tabular editor for defining interconnected processes and their performance configuration.

DETAILED DESCRIPTION

Like reference symbols in the various drawings indicate like elements.

This document describes a system and method of using virtualized communication channels to facilitate the development and hardening of processing services. In particular, the system and method described herein can be used to design and implement any number of application-specific integrated circuits (ASICs) or field programmable gate arrays (FPGAs).

Figure 1:
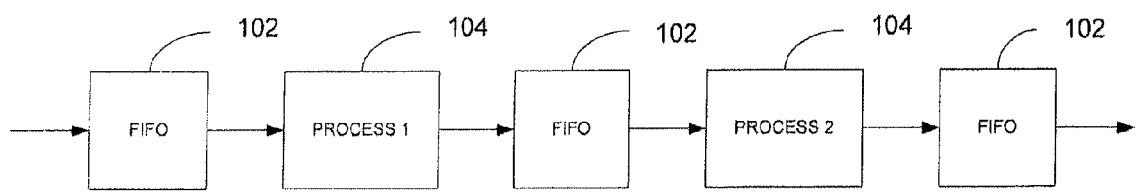
FIGS. 1-7 illustrate prior art methodologies associated with electronic system design.
Figure 2:
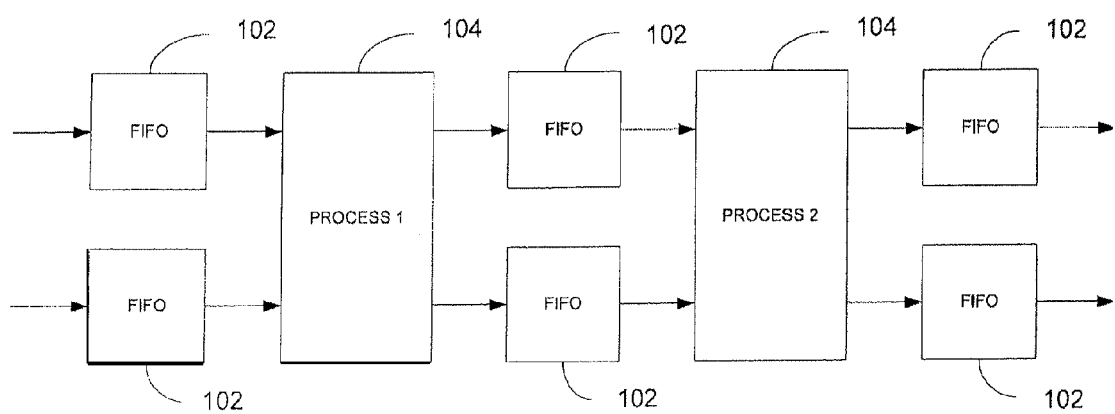
Figure 3:
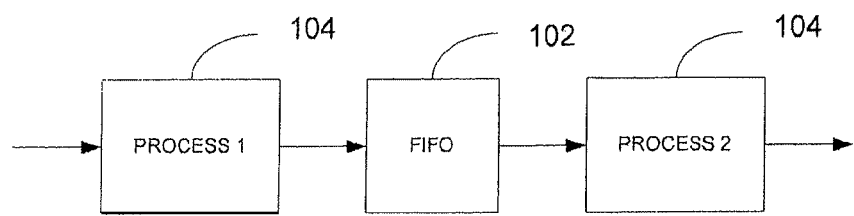
Figure 4:
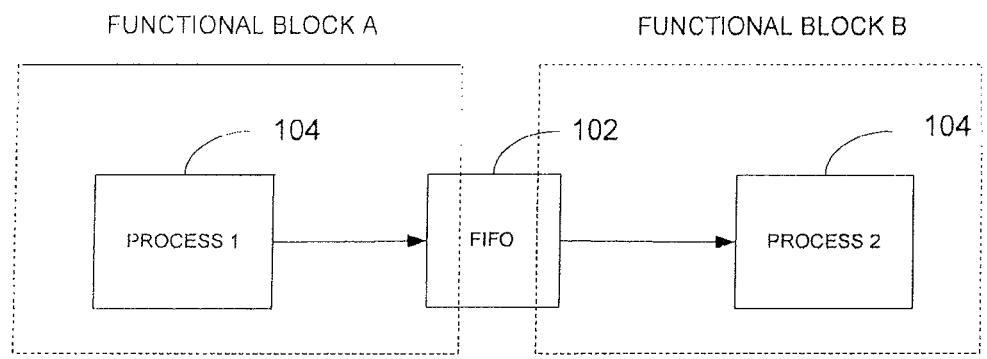
Figure 5:
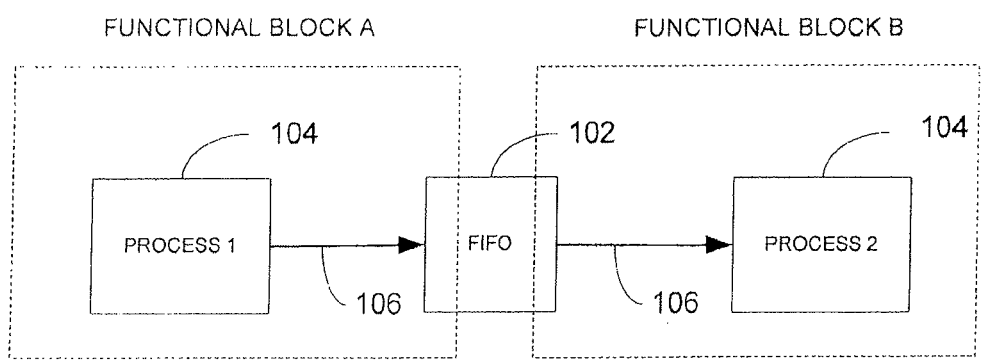
Figure 6:
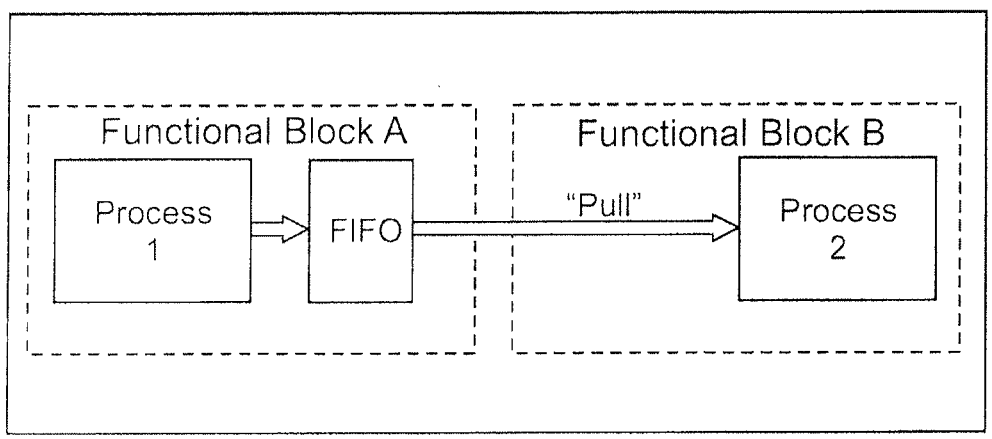
Figure 7:
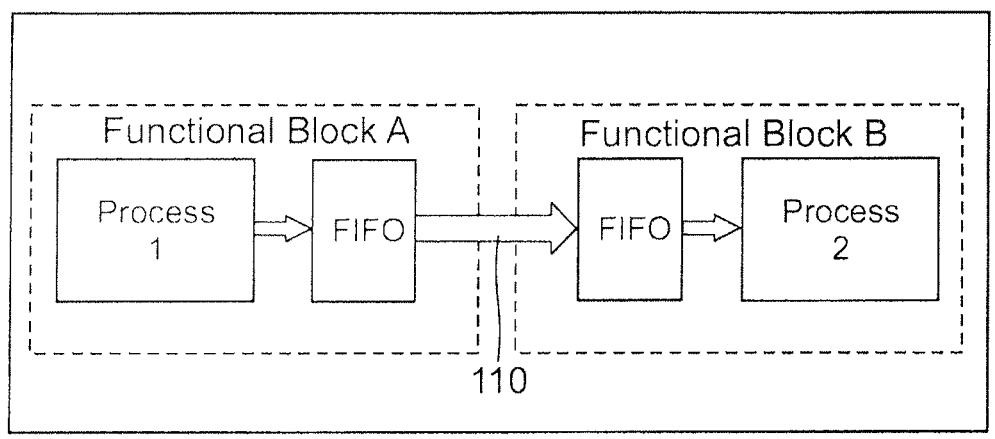
Figure 8:
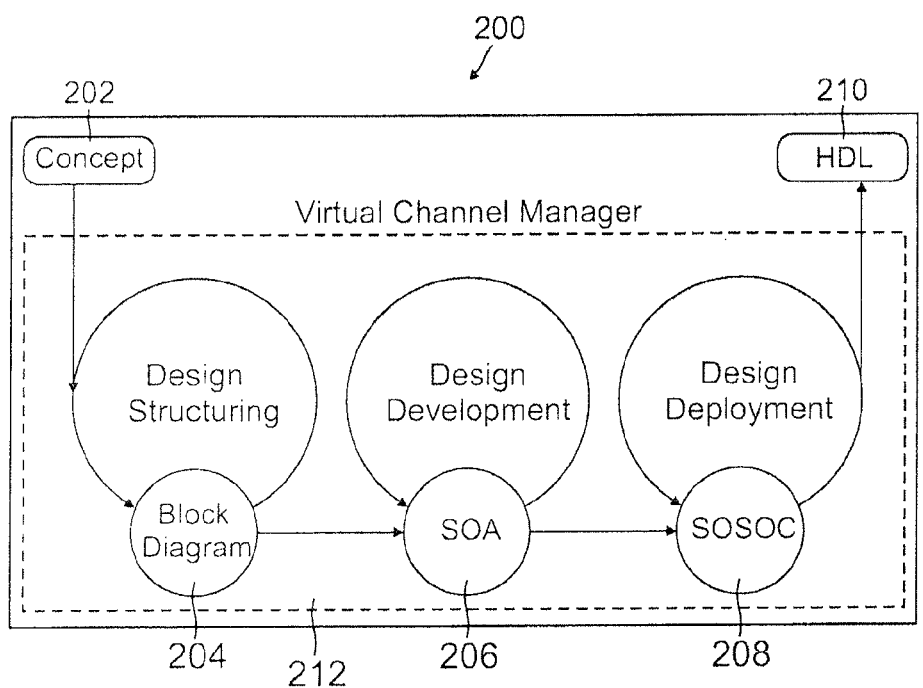
FIG. 8 illustrates a method for designing and deploying an electronic system.

With reference to FIG. 8, a method 200 for designing an electronic system includes, starting on the left with a concept 202 and the design entry thereof, producing a block diagram 204 of processing services and communication channels. Once stabilized, the block diagram 204 is transformed into a web-enabled Service Orientated Architecture (SOA) 206 format. The design then proceeds through an iterative community-based design development life-cycle facilitated through SOA messaging and protocols. Once the design has sufficiently achieved its design objectives, the design is then transformed into a specific System Of Systems On a Chip (SOSOC) 208 architectural configuration to produce a hardware definition language 210 design of an electronic system. The design methodology is executed on a virtual channel manager 212, design engine running on an open SOA platform and which is explained further below.

Figure 9:
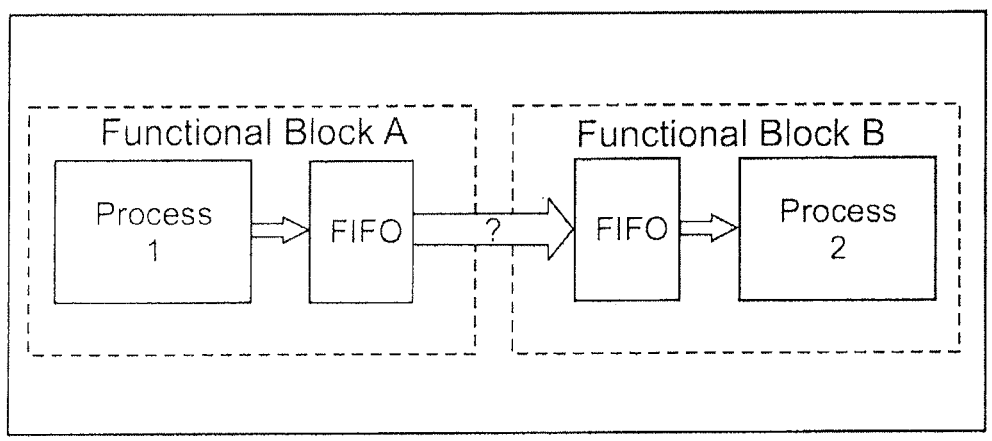
FIG. 9 illustrates defining functional processing modules.

In accordance with preferred implementations, and as illustrated in FIG. 9, a developer needs only to be concerned that the data that is written into the upstream FIFO can (eventually) be read from the downstream FIFO. As such, the specifics of the communications channel protocol can be treated as no concern to the designer through all but the final phases of system development. A designer can treat this communications channel as a virtual channel, i.e. a channel to be specified later. Through using a virtual channel as a functional place-holder, a realization/deployment tool can transparently select the communications protocol best suited to the set of physical conditions which are currently in effect.

The set of current physical conditions are dynamic in nature throughout the design developmental process. Therefore, the underlying channel protocol is transparently selected by the realization/deployment tool, and is dynamic throughout the design process. If a designer implicitly or explicitly specifies a virtual channel, then the realization/deployment tool can select the best channel protocol based upon current operating conditions. The realization/deployment tool is referred herein to as the "virtual channel manager" 212.

The virtual channel manager 212 is a design engine within which all design activity is to occur. In preferred implementations, the virtual channel manager 212 includes one or more computing devices, each having a general purpose processor for executing instructions that are stored on a tangible medium. The one or more computing devices are connected together by a communications network. A computing device can be a personal computer, a computer workstation, etc. The tangible medium can be a hard disk drive, solid state memory chips, RAM, ROM, etc.

The virtual channel manager 212 can implement fault detection/correction through redundancy of functional blocks. The virtual channel manager 212 can retire, adopt, replace or upgrade functional blocks as needed, and can reconfigure the location of functional blocks as needed. The virtual channel manager 212 can select which channel protocol to use as needed, can utilize functional blocks that are simulated, emulated and/or fully realized, and can broker functional blocks between disparate design organizations. In summary, a virtual channel manager 212 can broker each phase of a system's development as it evolves from concept 202 to an SOSOC 206.

In accordance with a preferred implementation, the designer conforms each virtual-channel-compatible process to a message passing architecture, and needs to establish the source and destination(s) of all virtual channels. The designer operates the design within an environment that implements a virtual channel manager 212.

Figure 10:
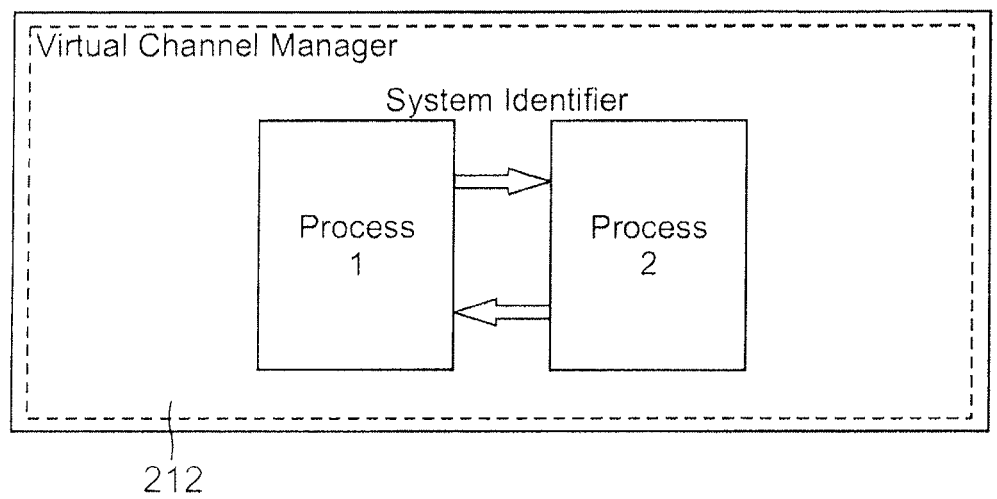
FIG. 10 illustrates defining a system of interconnected processes in a graphical editor.

FIG. 10 shows an example of design structuring of the virtual channel manager 212, which can be implemented as a web-enabled distributed application written in the Java programming language, and include a graphical editor for display on a user display. From within the virtual channel manager's 212 graphical editor, the designer can generate graphical boxes to represent discrete functional processes (i.e.: "processing services"), graphically supply a unique name, one for each processing service represented by a graphical box (for example "Process 1"), and graphically generate communication channels represented by drawing directional arrows between source and destination processes. The designer can also graphically identify one or more communication channels (such as through the act of double-clicking on a (group of) graphical arrow(s)) and then be able to graphically specify the packet format for that (group of) channel(s), and graphically establish an identifier for this configuration of processing services (for example the "System Identifier" text as shown).

Alternatively, the virtual channel manager's graphical editor can interact with the designer using a tabular data entry technique. Once the design is established and deemed by the designer to be complete and as desired, then the designer can instigate the virtual channel manager 212 to begin the transformation of converting the graphical design architecture into an SOA compatible representation of the captured design. This process is depicted in FIG. 11.

Figure 12:
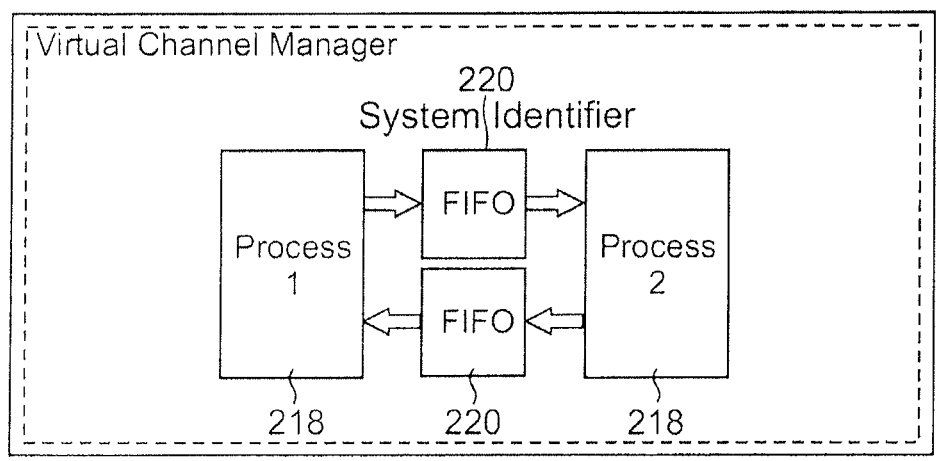
FIG. 12 shows defined processes interconnected with FIFOs.
Figure 13:
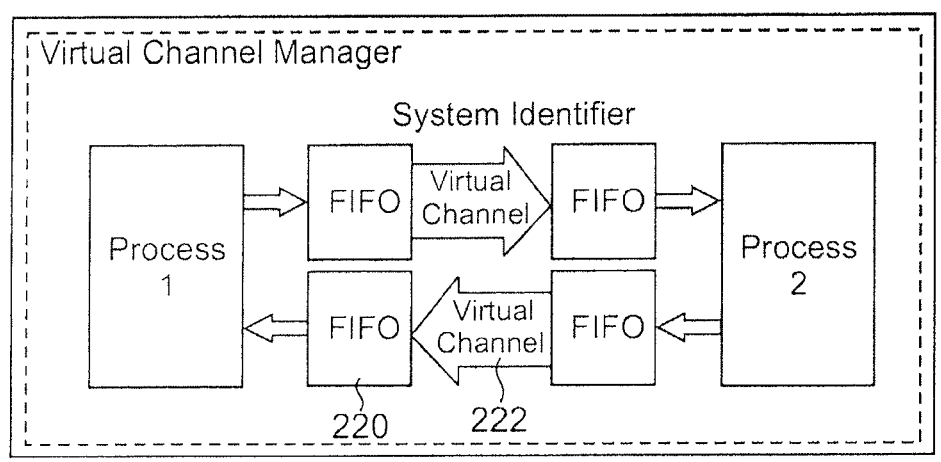
FIG. 13 illustrates defining a virtual channel between the FIFOs.
Figure 14:
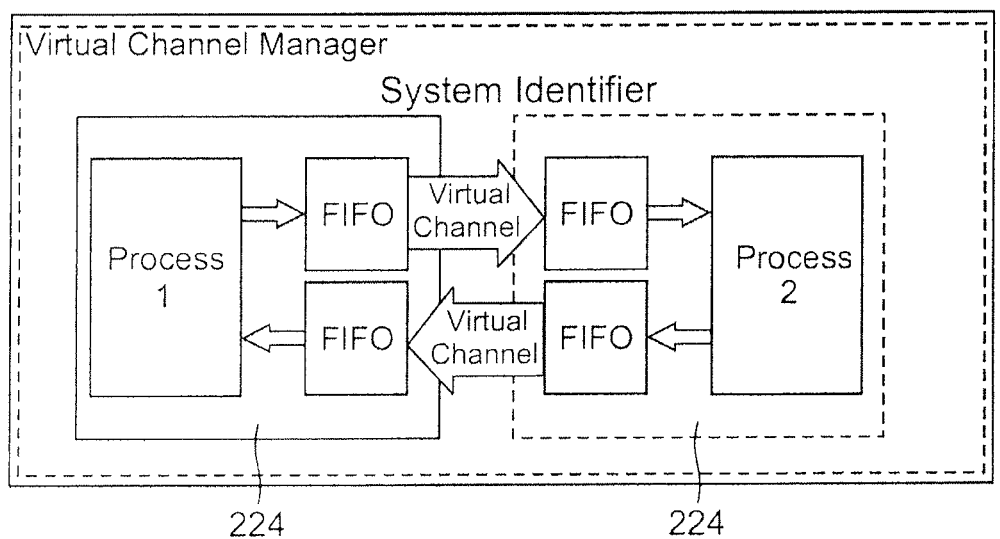
FIG. 14 illustrates providing a hierarchical structure to the system definition.

As shown in FIG. 12, each (graphical or tabular) communication channel that is specified by the system designer will become transformed into a pair of (conceptual) data-flow interfaces which incorporate a newly inferred (conceptual) FIFO queue 220. As depicted in FIG. 13, each FIFO queue 220 from FIG. 12 will then be restructured such that the original single-element FIFO 220 becomes represented as a pair of FIFOs 220 separated by a virtual channel 222. As shown in FIG. 14, once the design is represented in a form incorporating virtual channels 222, the virtual channel manager 212 can introduce a hierarchy—i.e. one hierarchical block per process 218. These hierarchical blocks 224 group each processing block with its respective FIFO queues 220. Notably, all interfaces penetrating these newly introduced hierarchical blocks are exclusively virtual channel interfaces.

Figure 15:
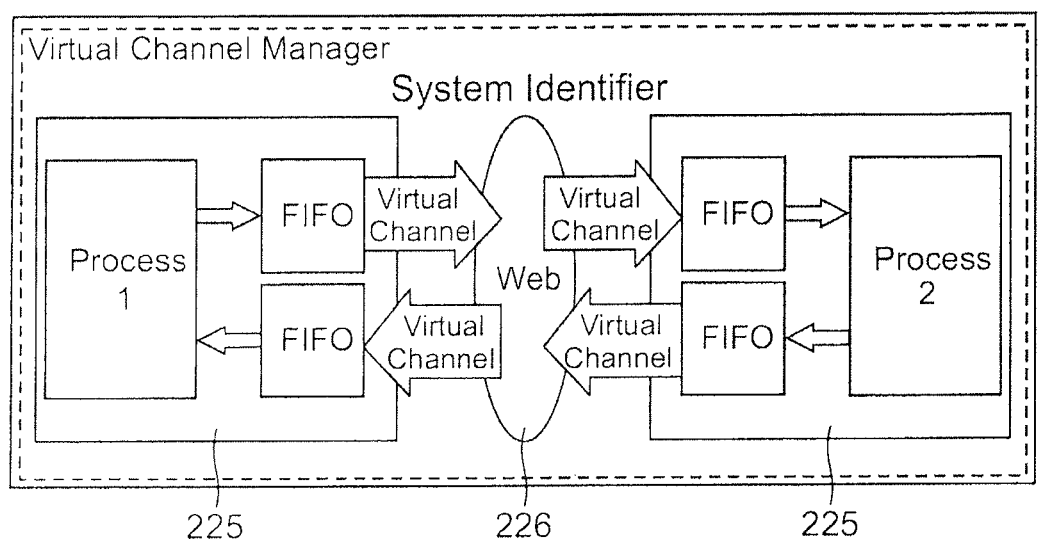
FIG. 15 shows a network being defined for interconnecting the hierarchical structure.
Figure 16:
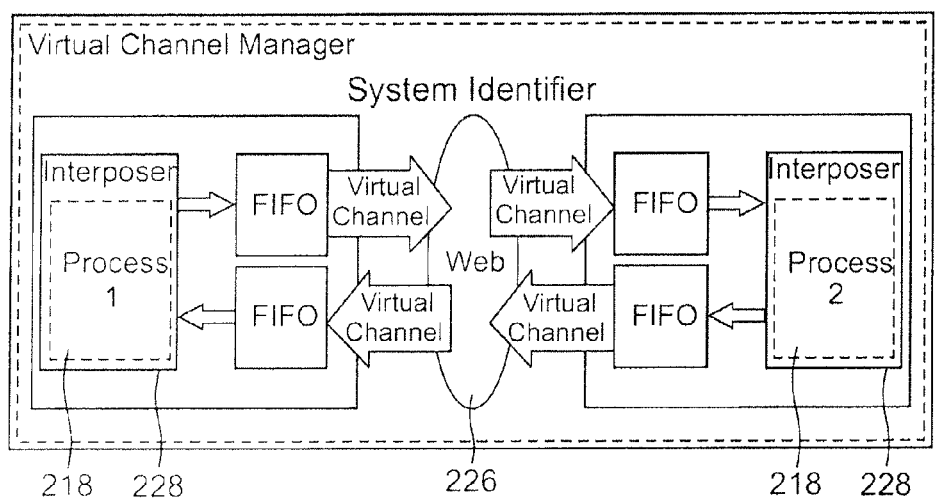
FIG. 16 shows subordinating each process in an interposer.

Each of these newly introduced hierarchical blocks 224 can now be individually referred to as a discrete SOA processing service 225. FIG. 15 shows how these SOA processing services 225 can then be interconnected via any interconnection network 226—such as an intranet, an extranet or the Internet. To prepare the architectural structure for the next transformation, as seen in FIG. 16, each functional process 218 is subordinated to reside within an interposer 218 (sometimes referred to as a "wrapper"). The transition which occurs between FIG. 16 and FIG. 17 is one of several main transformations executed by the design methodology described herein.

Figure 17:
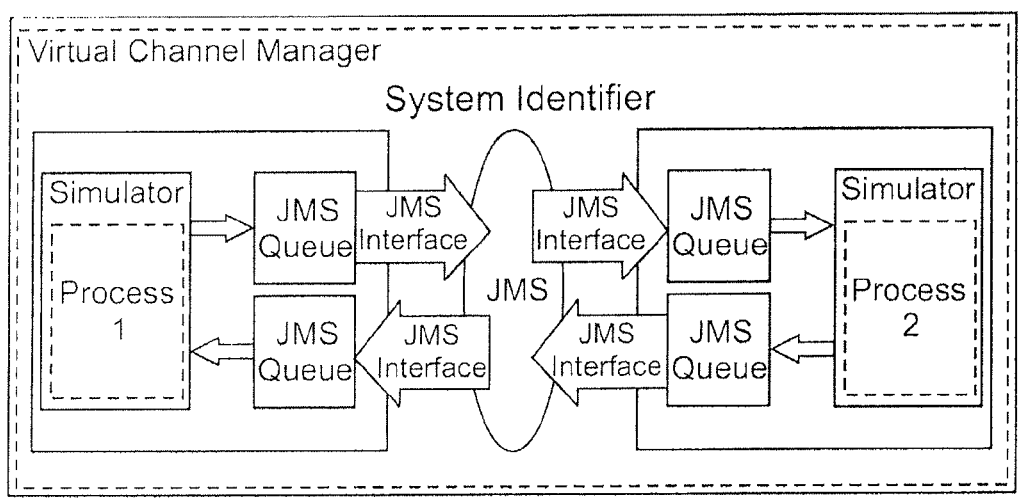
FIG. 17 shows the system definition being redefined in Java.

As depicted in FIG. 17, each of the objective design modules, the processes 218, are represented within a hardware-centric programming language (such as VHDL) to generate a fully-operable, java-based, web-enabled, unified SOA design. This is the structural (SOA) organization through which each individual hardware-centric process 218 can be built in silicon.

Within this architecture, each process has the ability to be independently developed (i.e.: independent designers, independent teams of designers or even independent organizations) as well as the ability to contribute to the system as a whole regardless of the Process state within the process developmental life-cycle (i.e.: System C, behavioral VHDL, RTL VHDL, gate-level VHDL, emulated gates, or even fully realized silicon). Each process further exhibits the ability to simulate as a system member through the use of distributed simulation equipment (e.g.: a community of connected-via-Ethernet client computers running the virtual channel manager client application), and the ability to advertise its services for use on other projects within the virtual channel manager community. Lastly, each process exhibits the ability for the virtual channel manager to broker/escrow/validate/deliver processing services and IP between members of the virtual channel manager community.

Figure 18:
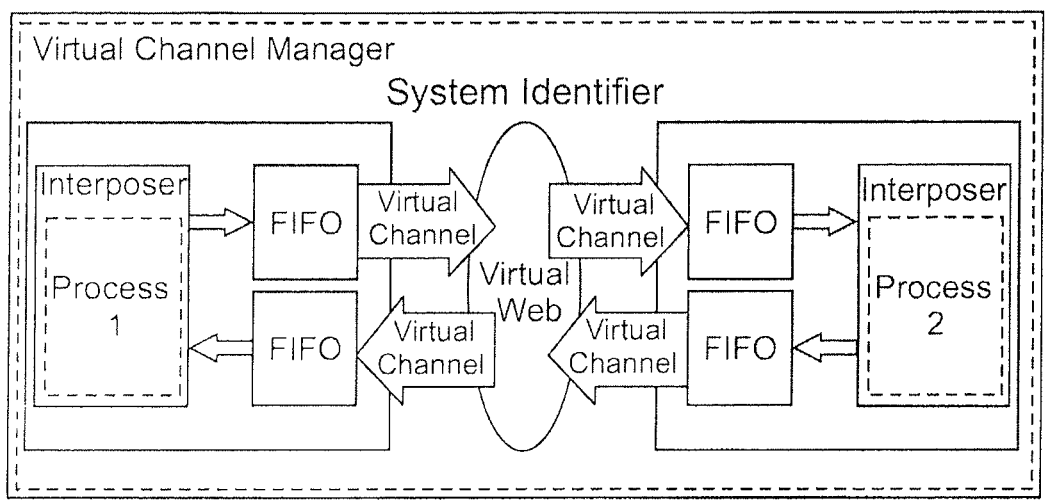
FIGS. 18-21 show the system definition transformed to a SOA implementation for testing and editing.
Figure 19:
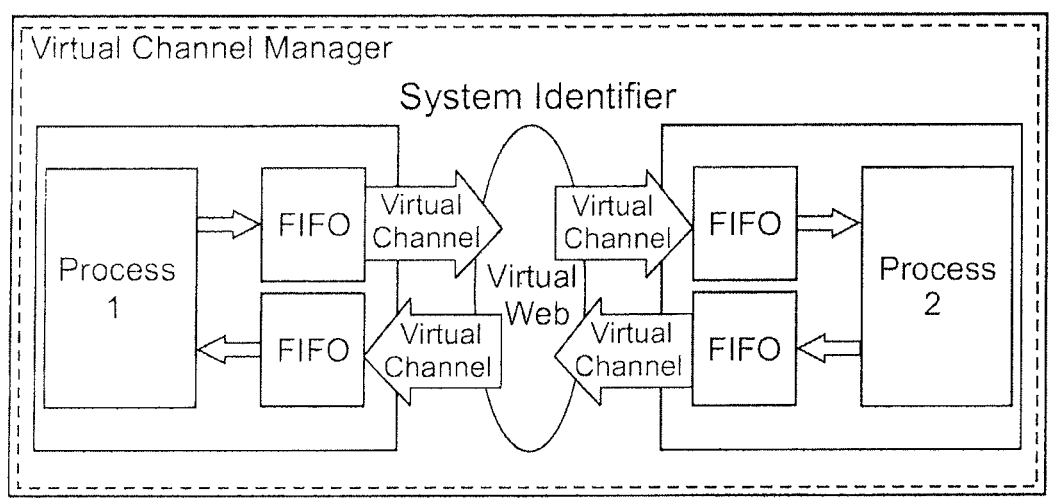
Figure 20:
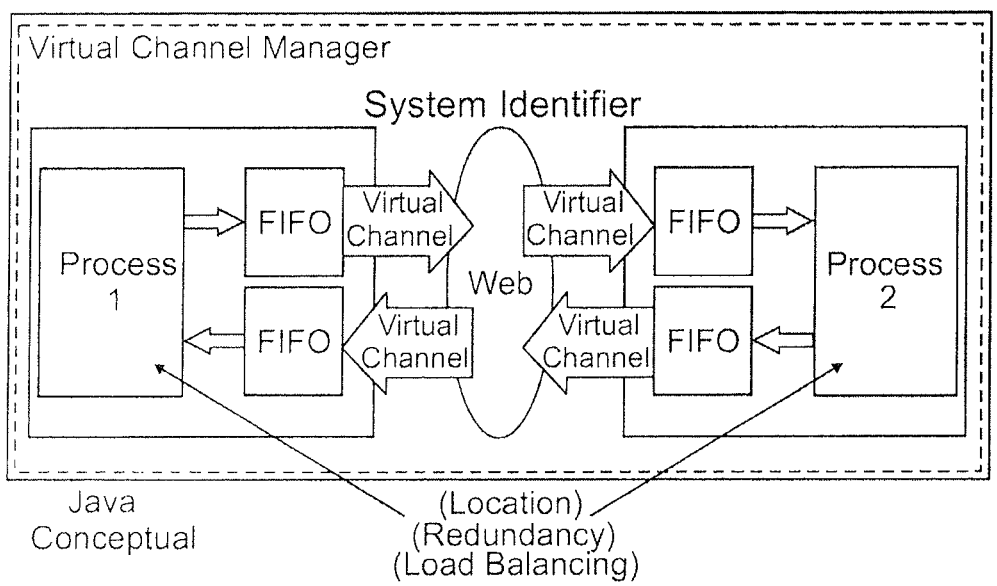
Figure 21:
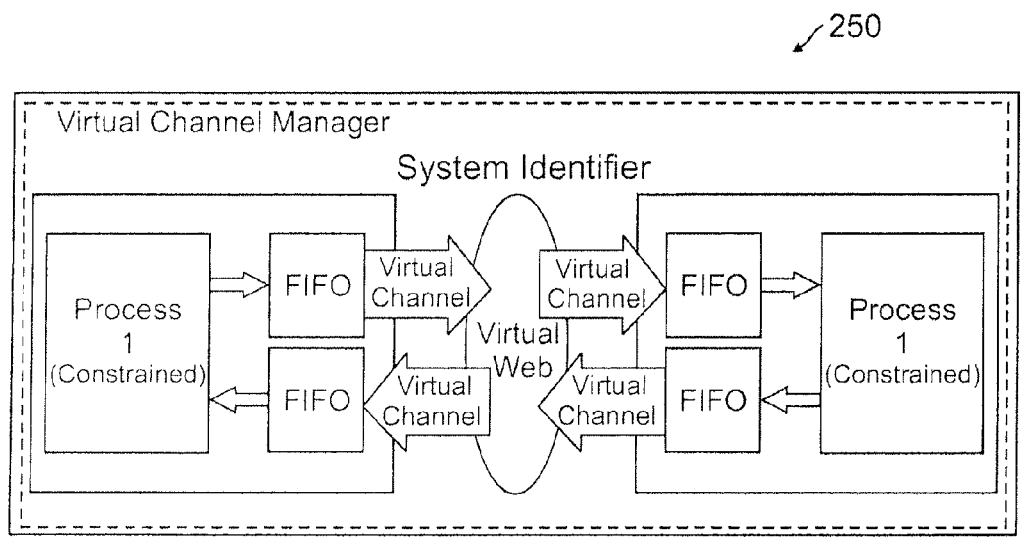

Once the system is operating as desired, as shown in FIG. 18, the system can be transformed towards design deployment (i.e.: its transformation towards a specific SOSOC architecture). This transformation will begin via a conceptual representation of the virtual channel infrastructure. As shown in FIG. 19, the first simplification is the removal of the interposer. Being that the target deployment hardware will be a specific SOSOC architecture, one or more physical constraints may be associated with each (group of) process(es), as shown in FIG. 20. FIG. 21 shows a completely constrained SOA system 250 that can be mapped into a specific target hardware architecture.

Figure 22:
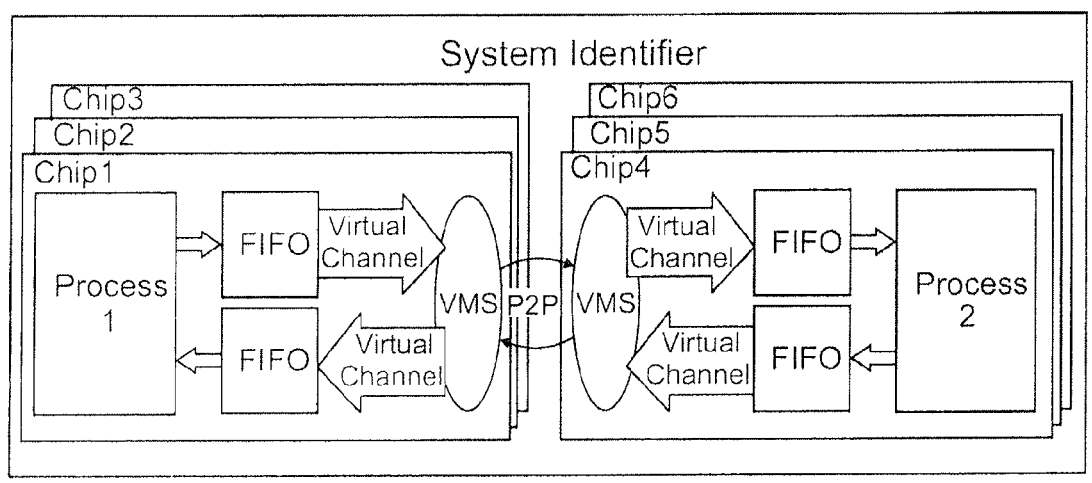
FIG. 22 shows a final system design implemented on one or more chips.

As can be seen in FIG. 22, for each conceptual block, there now exists a corresponding implementation-specific fully specified hardware structure called a VHDL messaging system (VMS). For example, this slide depicts the SOA architecture deployed into a set of chips (which reside on one or more circuit card assemblies). The virtual channel manager can not only generate the HDL (and constraint) files, one for each target chip, but can also generate HDL utilizable by industry standard circuit board and backplane design tools. The transition which occurred between the previous slide and this slide is the second of two crucial transformations defining this design methodology (i.e.: The mapping from a distributed web-enabled software-based SOA to a specific hardware-based SOSOC architecture).

Figure 23:
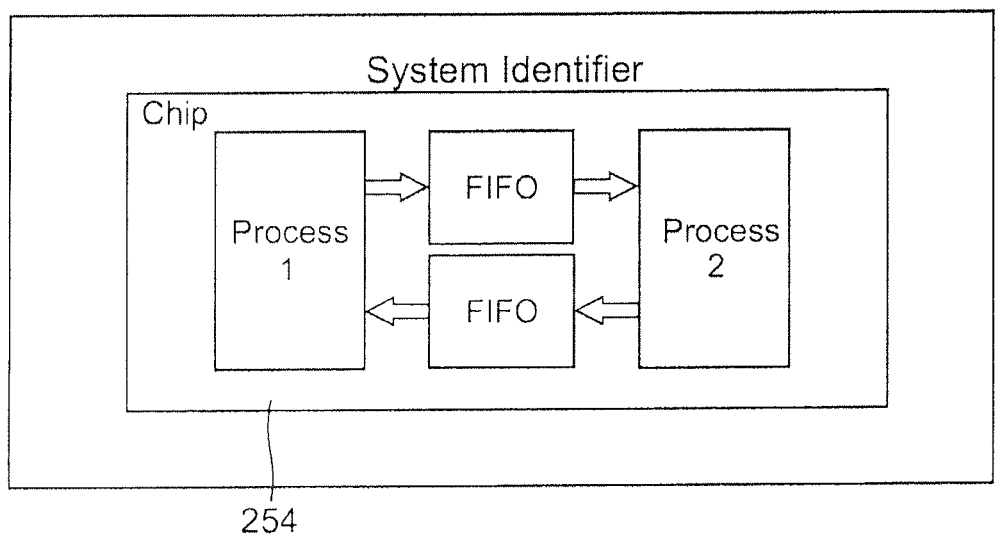
FIG. 23 illustrates a system of systems on a chip.

FIG. 23 shows an example implementation-specific architecture in which the entire SOA exists on one chip 254. In this manner, SOA processing services that share the same chip may not necessarily utilize the system-wide VMS fabric (i.e.: may use a more optimized point-to-point FIFO element as opposed to getting on/off the VMS router fabric).

Figure 24:
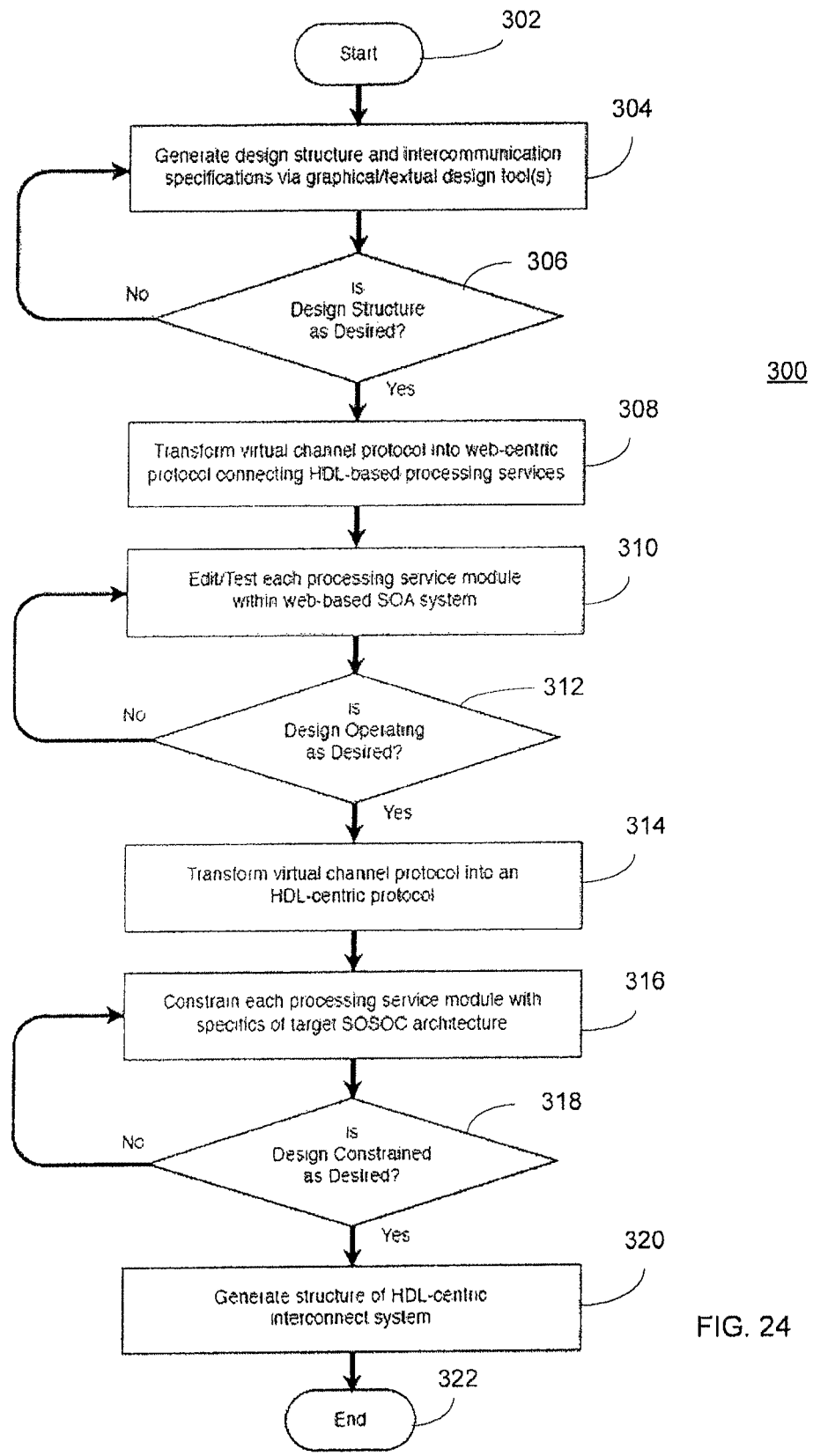
FIG. 24 is a flowchart of a design process for an electronic system.

FIG. 24 is a flowchart of a design process 300. The design process 300 and associated logic enables a methodology to facilitate the development of a system of processing services from a concept into a physical hardware device such as an ASIC, FPGA or system thereof. At 302, the process 300 starts. At 304, design structures and intercommunication specifications are generated via graphical/textual design tools hosted by a computing system and rendered for a user for interaction therewith, and saved to a computer network as a virtual channel protocol. At 306, it is determined whether the desired design structure is complete. If no, the process 300 continues at 304. If yes, at 308 the virtual channel protocol is transformed into a web-centric protocol connecting HDL-based processing services.

At 310, each processing service module can be edited or tested within a web-based SOA system and accessed by any number of users through the computer network. In some preferred implementations, the SOA is hosted on a server or set of servers, and executed by client computers via network application. In other implementations, a local application is run at each of the relevant client computers for editing and testing the processing services defined previously. At 312, it is determined whether the desired design operates as intended. If no, the process 300 continues at 310. If yes, at 314 the virtual channel protocol is transformed into an HDL-centric protocol.

At 316, each processing service module is constrained with specifics of a target SOSOC architecture. At 318, it is determined whether the design is constrained within the SOSOC architecture as intended or desired. If no, the process 300 continues at 316. If yes, at 320 a structure of an HDL-centric interconnected electronic system is generated, which can be provided in hardware as a set of electronic circuits and interconnects. At 322, the process 300 ends.

Key to this process 300 is the manner in which the virtual channels are identified and then successively transformed such that each phase of the design process uses an SOA protocol that is best suited for the design phase's respective design activities. Specifically, the transformation of the virtual channel(s) from a graphical/tabular representation to a web-centric protocol has been presented, and then the transformation of the virtual channel(s) from a software-based, web-centric protocol to a hardware-based, chip-centric protocol.

Some or all of the functional operations or elements described in this specification, such as the virtual channel manager or interposer, can be implemented in digital electronic circuitry, or in computer software, firmware, or hardware, including the structures disclosed in this specification and their structural equivalents, or in combinations of them. Implementations can be implemented as one or more computer program products, i.e., one or more modules of computer program instructions encoded on a computer readable medium, e.g., a machine readable storage device, a machine readable storage medium, a memory device, or a machine-readable propagated signal, for execution by, or to control the operation of, data processing apparatus.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of them. A propagated signal is an artificially generated signal, e.g., a machine-generated electrical, optical, or electromagnetic signal, that is generated to encode information for transmission to suitable receiver apparatus.

A computer program (also referred to as a program, software, an application, a software application, a script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to, a communication interface to receive data from or transfer data to, or both, one or more mass storage devices for storing data, e.g., magnetic, magneto optical disks, or optical disks.

Moreover, a computer can be embedded in another device, e.g., a mobile telephone, a personal digital assistant (PDA), a mobile audio player, a Global Positioning System (GPS) receiver, to name just a few. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations of the invention can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

Certain features which, for clarity, are described in this specification in the context of separate implementations, may also be provided in combination in a single implementation. Conversely, various features which, for brevity, are described in the context of a single implementation, may also be provided in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular implementations of the invention have been described. Other implementations are within the scope of the following claims. For example, the steps recited in the claims can be performed in a different order and still achieve desirable results. In addition, implementations of the invention are not limited to database architectures that are relational; for example, the invention can be implemented to provide indexing and archiving methods and systems for databases built on models other than the relational model, e.g., navigational databases or object oriented databases, and for databases having records with complex attribute structures, e.g., object oriented programming objects or markup language documents. The processes described may be implemented by applications specifically performing archiving and retrieval functions or embedded within other applications.

The invention claimed is:

1. An electronic system design platform comprising:
a computing system that hosts a virtual channel manager, the virtual channel manager providing a graphical editor for receiving user input specifying design specifications of the integrated circuit, the design specifications specifying a number of functional blocks and current physical communication conditions between pairs of the functional blocks, the virtual channel manager further adapted for designing a channel interface for the current physical communication conditions between the pairs of the functional blocks, and selecting a communication protocol that is best suited for each channel interface, the graphical editor comprising a plurality of code modules to:
generate graphical boxes to represent discrete functional processing services;
graphically supply a unique name for each of the processing services represented by a graphical box;
graphically represent communication channels between source and destination processing services;
graphically identify one or more of the communication channels to provide a communication channel group;
graphically specify the packet format for the communication channel group; and
graphically establish an identifier for a configuration of the processing services that defines the integrated circuit design.

2. The electronic system design platform in accordance with claim 1, further comprising a computer aided circuit design platform to transform the functional blocks and selected communication protocols into structural specifications.

3. The electronic system design platform in accordance with claim 1, wherein the computing system operates according to a hardware description programming language.

4. The electronic system design platform in accordance with claim 1, wherein the computing system comprises a plurality of computer workstations connected together by a communications network, and wherein the virtual channel manager is comprised of a plurality of processing services communicating together in a service oriented architecture.

* * * * *